(12) United States Patent
Jung et al.

(10) Patent No.: US 7,488,959 B2
(45) Date of Patent: Feb. 10, 2009

(54) APPARATUS AND METHOD FOR PARTIAL ION IMPLANTATION

(75) Inventors: Yong Soo Jung, Seoul (KR); Seung Woo Jin, Icheon-si (KR); Min Yong Lee, Seoul (KR); Kyoung Bong Rouh, Goyang-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 239 days.

(21) Appl. No.: 11/423,306

(22) Filed: Jun. 9, 2006

(65) Prior Publication Data
US 2007/0187620 A1 Aug. 16, 2007

(30) Foreign Application Priority Data
Feb. 13, 2006 (KR) ...................... 10-2006-0013806

(51) Int. Cl.
*H01J 37/20* (2006.01)
(52) U.S. Cl. ............................. 250/492.21; 250/442.11
(58) Field of Classification Search ............ 250/492.21, 250/492.3
See application file for complete search history.

(56) References Cited

U.S. PATENT DOCUMENTS

| | | | | |
|---|---|---|---|---|
| 5,134,301 A * | 7/1992 | Kamata et al. | ............ | 250/492.2 |
| 6,207,959 B1 * | 3/2001 | Satoh et al. | ............ | 250/442.11 |
| 6,437,351 B1 * | 8/2002 | Smick et al. | ............ | 250/492.21 |
| 6,710,358 B1 * | 3/2004 | Chen et al. | ............ | 250/492.21 |
| 6,946,667 B2 * | 9/2005 | Chen et al. | ............ | 250/492.21 |
| 6,984,833 B2 | 1/2006 | Sano et al. | ............ | 250/492.21 |
| 7,019,314 B1 | 3/2006 | Benveniste et al. | ...... | 250/492.21 |
| 7,276,712 B2 * | 10/2007 | Ferrara | .................. | 250/492.21 |
| 7,319,505 B2 * | 1/2008 | Namba | ........................ | 355/30 |
| 2005/0230642 A1 * | 10/2005 | Halling et al. | ......... | 250/492.21 |
| 2007/0001129 A1 * | 1/2007 | Ferrara | .................. | 250/492.21 |

FOREIGN PATENT DOCUMENTS

| | | |
|---|---|---|
| JP | 10-321175 | 12/1998 |
| JP | 2000-294187 | 10/2000 |
| JP | 2003-249189 | 9/2003 |
| KR | 10-2003-0074716 | 9/2003 |

* cited by examiner

*Primary Examiner*—David A. Vanore
*Assistant Examiner*—Johnnie L Smith, II
(74) *Attorney, Agent, or Firm*—Marshall, Gerstein & Borun LLP

(57) ABSTRACT

Disclosed herein is an apparatus and method for partial ion implantation. The apparatus includes a wafer support, an ion beam irradiator capable of generating and irradiating an ion beam entering the wafer, and an ion beam exposure adjustor to adjust exposure of the wafer with respect to the ion beam according to regions of the wafer by setting an exposure opening via combination of ion beam shields for blocking the ion beam with respect to the wafer. The exposure opening enables the wafer to be partially exposed to the ion beam irradiated therethrough. With this apparatus, effective partial ion implantation can be performed to compensate variation of a threshold voltage Vt in a channel of a transistor, thereby providing more uniform characteristics of the transistor.

16 Claims, 7 Drawing Sheets

APPARATUS AND METHOD FOR PARTIAL ION IMPLANTATION

BACKGROUND OF THE INVENTION

1. Field of the Invention

The present invention generally relates to semiconductor device manufacture and, more particularly, to an apparatus and method for partial ion implantation.

2. Description of the Related Art

Ion implantation has various applications in the manufacture of semiconductor devices. Ion implantation generally is a process to change electric properties to a region of a semiconductor substrate or a wafer by implanting a dopant to the region. Such an ion implantation process is applied to, for example, a process of forming a well on the wafer, a process of forming various junctions, a process of adjusting a threshold voltage Vt in a channel region of a transistor, and the like.

When manufacturing semiconductor devices, the ion implantation process is generally performed such that dopants are implanted in a uniform dose on a whole area of the wafer. Thus, apparatus for ion implantation have been developed to create a uniform dose profile in the whole region of the wafer.

Semiconductor devices are gradually decreasing in size in response to design criteria. Thus, even if a uniform dose profile of the dopants is realized in the whole region of the wafer, characteristics of the device can differ at respective regions. That is, the device suffers from non-uniform device characteristics according to the respective regions.

For example, even if ion implantation for adjusting the threshold voltage Vt in the channel of the transistor is uniformly performed on the whole region of the wafer, actual distribution of threshold voltage Vt in the channel can be non-uniform according to the respective regions of the wafer. It is generally understood that such a non-uniform distribution is caused by a process margin or other process parameters for subsequent processes.

For example, if there is a variation in a device's critical dimension (CD) during gate patterning, causing a gate's critical dimension of the transistor to vary at the respective regions of the wafer, for example, a substantial length of the channel is changed. Such variation in the gate's CD is caused by the process margin or the other process variables during exposure or etching, which is performed upon gate patterning.

If there is a variation in the gate's CD, then effective threshold voltages in the channels of individual transistors will differ from each other. Due to such uneven distribution of the effective threshold voltage Vt, the respective transistors exhibit uneven operating characteristics over the whole region of the wafer.

A method has been developed to compensate for the uneven operating characteristics of the transistors dependant on the regions of the wafer. According to the method, ion implantation for adjusting the threshold voltage of the channel is performed to allow a dose of dopants to vary according to the regions of the wafer. For example, to compensate for the influence of the gate's CDs being different from each other at the respective regions on the threshold voltage Vt, ion implantation for adjusting the threshold voltage of the channel can be performed such that different doses of dopants are implanted to the respective regions of the wafer. That is, the uneven distribution of threshold voltage Vt of the channel can be compensated via ion implantation for adjusting a partially uneven threshold voltage Vt.

Because a general apparatus for ion implantation is designed to realize uniform dose distribution on the whole region of the wafer, it is substantially difficult to perform ion implantation to realize non-uniform dose distribution using such an apparatus. Thus, there is a need for an apparatus capable of partial, non-uniform ion implantation to provide a partially uneven dose distribution.

SUMMARY OF THE INVENTION

Disclosed herein are an apparatus and method for partial ion implantation capable of providing a partially uneven dose distribution to different regions of a semiconductor substrate or wafer.

In accordance with one aspect of the present invention, disclosed herein is an apparatus for partial ion implantation. The apparatus includes a wafer support, and an ion beam irradiator capable of generating and irradiating an ion beam entering a wafer. The apparatus also includes an ion beam exposure adjustor capable of adjusting exposure of the wafer with respect to the ion beam according to regions of the wafer by blocking the ion beam to partially expose the wafer to the ion beam.

The ion beam exposure adjustor may be installed to adjust the exposure of regions of the wafer to the ion beam. An exposure opening is set via a combination of ion beam shields capable of blocking the ion beam. The exposure opening enables the wafer to be partially exposed to the ion beam irradiated therethrough.

The ion beam exposure adjustor may be positioned in front of the wafer to allow variation in size or position of the exposure opening through which the ion beam passes.

The wafer support may repetitiously move in a predetermined direction while the ion beam irradiator repetitiously scans the ion beam in a direction different from the moving direction of the wafer support to allow a whole region of the wafer to be irradiated by the ion beam. The ion beam exposure adjustor may operate in conjunction with the movement of the wafer support to maintain the exposure opening for the ion beam with respect to the wafer.

The ion beam shields may be positioned in front of the wafer to partially block a surface of the wafer with respect to the ion beam, and the ion beam exposure adjustor may include a shield-combining part to move and combine the ion beam shields and thereby vary the size and position of the exposure opening with respect to the wafer.

The shield-combining part may include a driving supporter connected to the wafer support, and a shaft connecting the driving supporter and the ion beam shields.

The shield-combining part may rotate the combination of the ion beam shields about the wafer.

The ion beam shields may be separated an equal distance from the wafer in front thereof to move independently in parallel to each other and then combine with each other to set the exposure opening for the ion beam. The ion beam shields may be arranged in parallel to each other in two rows. The ion beam shields may be positioned in multiple layers in front of the wafer to move independently in parallel to each other and then combine with each other to set the exposure opening for the ion beam. The ion beam shields may include first ion beam shields arranged in one of the layers to face each other, and second ion beam shields arranged in another layer to block a region between the first ion beam shields.

In accordance with another aspect of the present invention, disclosed herein is a method for partial ion implantation to implant ions on respective regions of a wafer in different doses. The method includes mounting a wafer on a wafer support such that the wafer faces an ion beam irradiated from an ion beam irradiator. The method also includes primarily adjusting an ion beam exposure adjustor to allow a first region of the wafer to be partially exposed to the ion beam, and primarily implanting ions by scanning the ion beam on the exposed first region. The method further includes secondarily adjusting the ion beam exposure adjustor to allow a second region of the wafer to be exposed to the ion beam, and secondarily implanting ions by scanning the ion beam on the exposed second region.

During the ion implanting steps, the concentration of ions implanted to regions of the wafer may be controlled by the number of times the ion beam is repetitiously scanned.

Each of the ion implanting steps may include rotating either the ion beam exposure adjustor or the wafer.

The method may further include rotating either the ion beam exposure adjustor or the wafer before the secondary ion implanting step.

The second region of the wafer may include the first region of the wafer.

According to the invention, the apparatus and/or method for partial ion implantation can realize partially uneven dose distribution dependant on the regions of the wafer.

Additional features of the invention may become apparent to those skilled in the art from a review of the following detailed description, taken in conjunction with the drawings and the appended claims.

BRIEF DESCRIPTION OF THE DRAWINGS

For a more complete understanding of the disclosure, reference should be made to the following detailed description and accompanying drawing wherein.

While the disclosed apparatus and method are susceptible of embodiments in various forms, there are illustrated in the drawing (and will hereafter be described) specific embodiments of the invention, with the understanding that the disclosure is intended to be illustrative, and is not intended to limit the invention to the specific embodiments described and illustrated herein.

DETAILED DESCRIPTION OF THE INVENTION

An apparatus for non-uniform or partial ion implantation can allow doses of ions to be differently distributed in respective regions of a wafer, that is, the apparatus can achieve partially uneven dose distribution of the ions. The apparatus includes an ion beam exposure adjustor, which can guide an irradiating ion beam to different regions of the wafer.

The ion beam exposure adjustor is positioned in front of the wafer, and permits the ion beam to irradiate a specified region on the surface of the wafer. Accordingly, it can be understood that the ion beam exposure adjustor can serve as a shield, a filter or an iris, which shields other regions on the surface of the wafer, thereby allowing the ion beam to irradiate only specified regions on the surface of the wafer.

The ion beam exposure adjustor may be adapted to vary the size of the region exposed to the transmitted ion beam. For example, the ion beam exposure adjustor may be configured as an assembly of a plurality of shields, each of which serves to block the ion beam. Positions and/or sizes of the region of the wafer exposed to the transmitted ion beam can be changed by adjusting relative positions of the shields. In this manner, the ion beam exposure adjustor can be adjusted to allow the ion beam to arrive at the specified region on the surface of the wafer.

Accordingly, because the ion beam adjustor can change the positions and sizes of the regions of the wafer exposed to the ion beam, it is possible to adjust a period of time for the surface of the wafer to be exposed to the ion beam according to the regions on the surface of the wafer. Thus, it is possible to implant different doses of dopant to regions of the wafer.

Because the ion implantation apparatus is capable of non-uniform and/or partial ion implantation, it is possible to perform the partial ion implantation such that different doses of dopant are implanted according to the regions of the wafer. Accordingly, it is possible to perform ion implantation for controlling a threshold voltage Vt by allowing different doses of dopant to be implanted according to the regions of the wafer so as to compensate non-uniform distribution of a gate's CD which can be different at the regions of the wafer. Thus, it is possible to accomplish uniform distribution of the threshold voltage Vt in the whole regions of the wafer irrespective of variation in the gate's CD.

Figure 1:
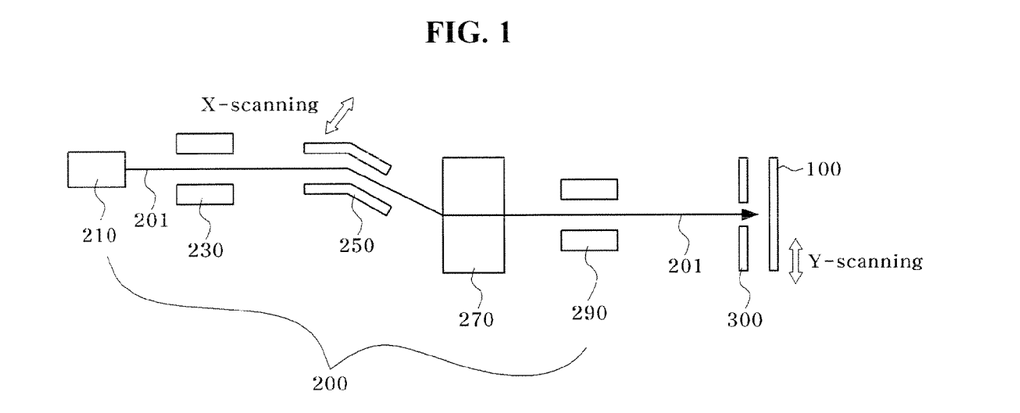
FIG. 1 illustrates an apparatus for partial ion implantation in accordance with an embodiment of the present invention.

FIGS. 1 to 5 schematically show an apparatus for partial ion implantation according to one embodiment of the invention. Referring to FIG. 1, the apparatus includes units to irradiate an ion beam 201 to a wafer 100. An ion beam irradiation unit 200 includes an ion beam source 210, an ion beam size adjustor 230, an X-scanner 250, a beam balancer 270, and an accelerator 290.

The ion beam 201 is adjusted to a preset size by the ion beam size adjustor 230, which includes a quadrupole magnet assembly. The X-scanner 250 serves to realize scan driving of the ion beam 201, for example, scan driving in a direction of an X-axis, such that the ion beam 201 can reach the whole region of the wafer 100.

The beam balancer 270 is capable of adjusting the ion beam 201 such that paths of the ion beam 201 remain in parallel. In addition, the accelerator 290 accelerates charged ions of the ion beam 201. At this time, the accelerator 290 may be positioned in front of the X-scanner 250.

The ion beam 201 is irradiated to enter the wafer 100. At this time, the wafer 100 can be moved in a direction, for example, in a direction of the Y-axis, which is different from a scanning direction of the ion beam 201, which is scanned on the wafer in a direction of the X-axis by driving the X-scanner 250, thereby realizing Y-scanning. The ion beam 201 can be irradiated over the whole region of the wafer 100 via combination of the X-scanning and the Y-scanning.

The ion beam exposure adjustor 300 is positioned in front of the wafer 100 to guide the ion beam 201 to selectively enter only a specific region on the surface of the wafer 100, for example, a center or an edge of the wafer 100, when the ion beam 201 is scanned on the wafer 100.

The ion beam exposure adjustor 300 can be understood as a shield, a filter or an iris, which shields entrance of the ion beam 210 to the wafer 100 dependant on regions of the wafer 100. That is, it can be understood that the ion beam exposure adjustor 300 permits the specific region of the wafer 100 to be exposed to the ion beam 201.

Figure 2:
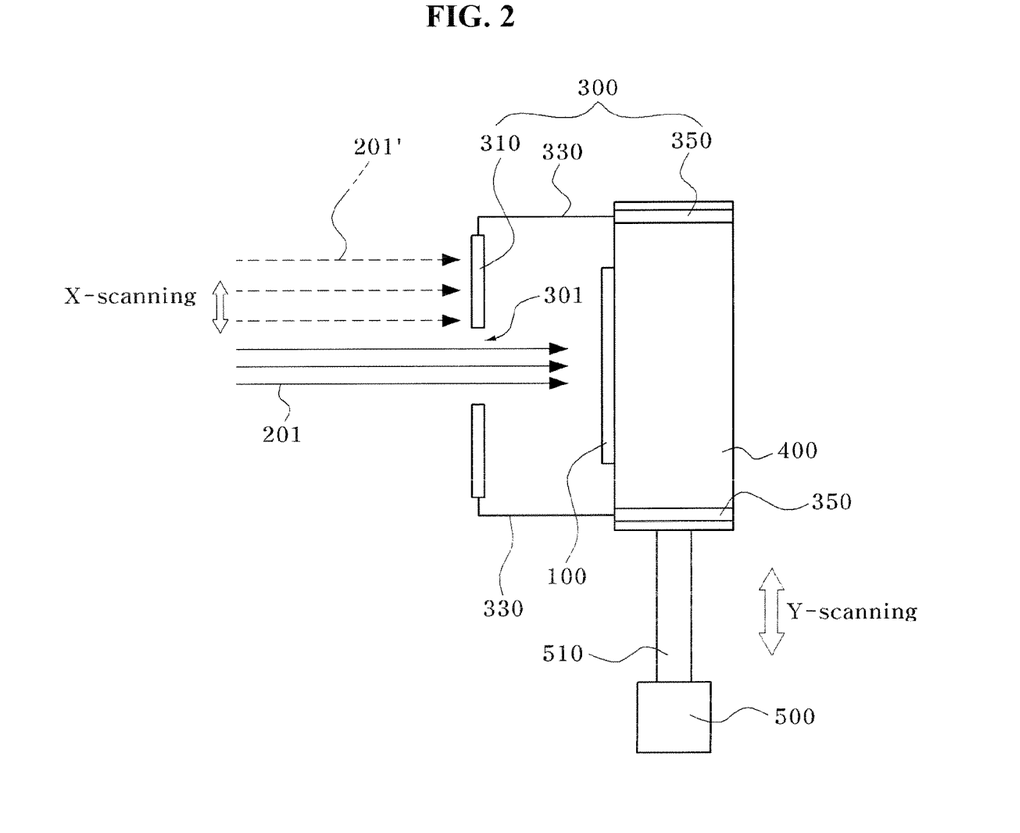
FIGS. 2 and 3 are schematic views illustrating operation of an ion beam exposure adjustor of the apparatus.
Figure 3:
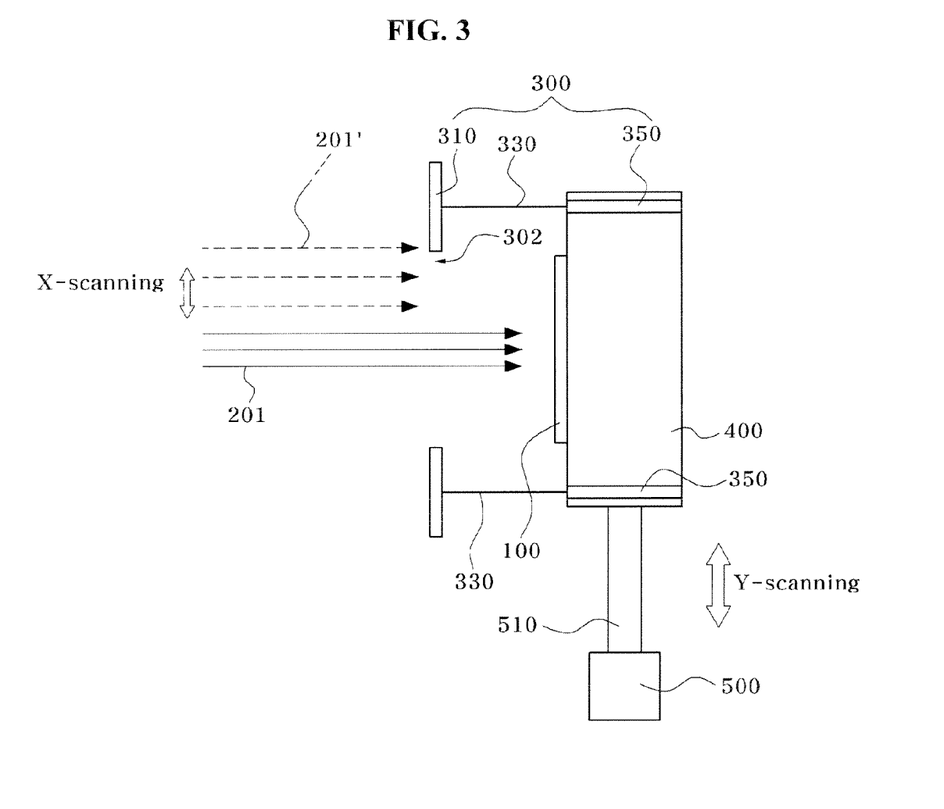

Referring to FIGS. 2 and 3, the ion beam exposure adjustor 300 includes ion beam shields 310, and shield combining parts 330 and 350. The ion beam shields 310 are positioned in front of the wafer 100 mounted on a wafer support 400, for example, on a chuck, and serve to substantially block the ion beam 201. The ion beam shields 310 can constitute the ion beam exposure adjustor 300 as an assembly of a plurality of ion beam shields 310.

As shown in FIG. 2, an exposure opening 301 is a region set by combination of the ion beam shields 310, and allows the ion beam 201 to enter the wafer therethrough without being blocked by the ion beam shields 310. Thus, the exposure opening 301 enables the ion beam 210 to enter only the specific region on the surface of the wafer 100 corresponding to the exposure opening 301, so that only the specific region of the wafer is implanted with ions.

The ion beam 201 is scanned on the wafer via X-scanning such that an ion beam 201', changed in position via X-scanning from an initial position of the ion beam 201, is blocked by the ion beam shields 310, as shown in FIG. 2. Accordingly, the ion beam 201 is not irradiated to a region of the wafer 100 blocked by the ion beam shields 310, so that the ion implantation is not performed on the blocked region of the wafer 100.

After performing a primary ion implantation in this state, the ion beam shields 310 are recombined to set an exposure opening 302 corresponding to a greater region of the wafer, for example, the whole region of the wafer 100 as shown in FIG. 3, and then a secondary ion implantation is performed by the ion beams 201 and 201' in a uniform dose or concentration over the whole region of the wafer 100 via X-scanning.

If the primary and secondary ion implantations are performed in such a manner as described above, exposure of the wafer 100 to the ion beam 201 can be adjusted according to the regions of the wafer via introduction of the ion beam shields 310. It is possible to control the ion beam 201 to selectively reach the specific region of the wafer 100 by adjusting the size and/or the position of the exposure opening 302 via control of a combined state or arrangement of the ion beam shields 310.

As shown in FIGS. 2 and 3, because it is possible to control the ion beam 201 to selectively reach the respective regions of the wafer 100, that is, since it is possible to control an exposure degree with respect to the ion beam 201 at the respective regions of the wafer 100, it is possible to vary a concentration of the dopant implanted to the regions of the wafer 100. It is possible to provide different dose distributions of ion implantation to the respective regions of the wafer 100. Accordingly, it is possible to perform non-uniform or partial ion implantation which can be appreciated as ion implantation to a local region.

The shields 310 can change the size of the exposure opening 301 or 302, or a relative position thereof with respect to the wafer 100. For this purpose, shield combining parts 330 and 350 can adjust the relative position of the shields 310 with respect to the wafer. The shield combining parts 330 and 350 include a driving support 350 connected to the wafer support 400, and a shaft 330 connecting the driving support 350 and individual shields 310.

The driving support 350 controls movement of the individual shields 310 via the shaft 330, and supplies driving force for combining the shields 310 to define the exposure opening 301 having a predetermined shape and size. At this time, the driving support 350 may be connected with a chuck, which is the wafer support 400. Alternatively, the driving support 350 is installed outside the ion implantation chamber having the chuck provided thereto.

The driving support 350 is connected to the wafer support 400, so that the shields 310 move together in conjunction with movement of the wafer support 400 (e.g., movement for Y-scanning in a state wherein the shields 310 are individually combined to set the exposure opening 301). Accordingly, the relative position of the preset exposure opening 301 to the wafer can be maintained upon Y-scanning of the wafer 100.

At this time, the wafer support 400 may be further provided with a Y-scanning driver 500 and a Y-scanning drive shaft 510 for the Y-scanning. Although the ion implantation apparatus of this embodiment is illustrated as irradiating the ion beam 201 to the whole region of the wafer 100 in an X-Y scanning manner, the present embodiment can be applied to various ion implantation apparatuses useful in other types of scanning manners.

In addition, the combination of the shields 310 assembled to set the exposure opening 301 in conjunction with rotation of the wafer support 400 can rotate in conjunction with the rotation of the wafer support 400 while maintaining this state. At this time, the combination of the shields 310 can be driven by the shield combining parts 330 and 350 such that the combination of the shields 310 rotates independent of the wafer support 400.

As such, the rotation of the wafer support 400 or the rotation of the shields 310 advantageously guides the ion beam 201 arriving at the wafer 100 after passing through the exposure opening 301 to perform more uniform ion implantation. In addition, the rotation of the wafer support 400 or the rotation of the shields 310 can be performed during the ion implantation or at an intermediate step between partial ion implantation processes. Such rotation can be performed to allow change in relative angle of the wafer 100 or the combination of the shields 310 within a predetermined angle.

Figure 4:
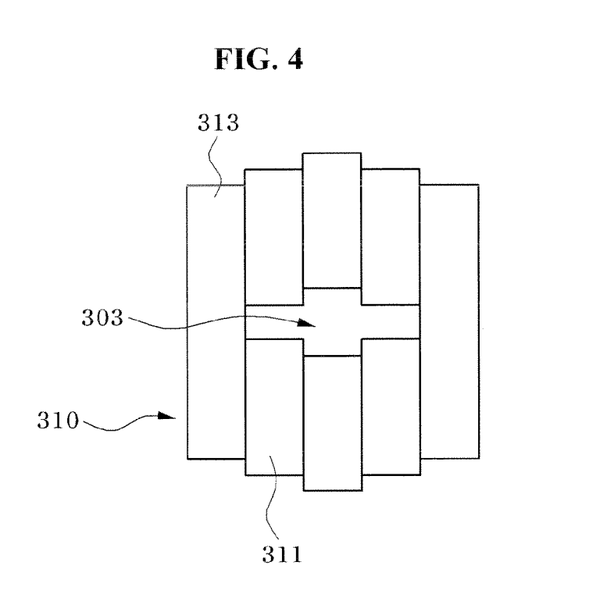
FIGS. 4 and 5 are schematic plan views illustrating the ion beam exposure adjustor of the apparatus.
Figure 5:
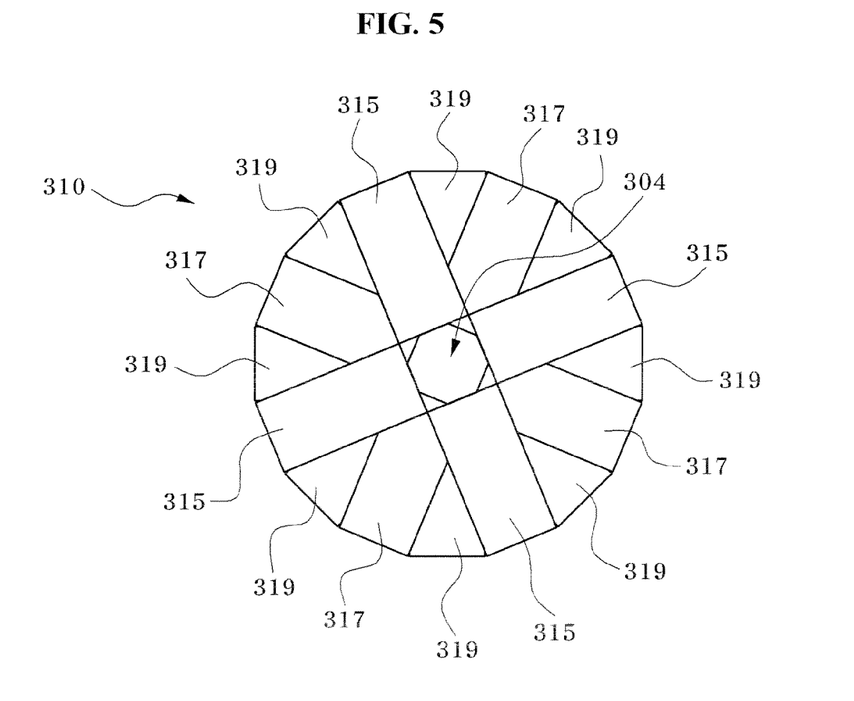

Referring to FIGS. 4 and 5, the ion beam shields 310 can be arranged in various combinations according to the shapes of the ion beam shields 310. For example, as shown in FIG. 4, the combination of the shields 310 constitute a two-row arrangement, which includes a first shield row having the shields 311 arranged in line on a first row at a lower side of the combination, and a second shield row having the shields 310 arranged in line on a second row at an upper side thereof. At this time, the individual shields 311 and 313 move in parallel to each other while maintaining an equal distance to the wafer 100, respectively. Accordingly, it is possible to realize the exposure opening 303 of various shapes via the combination of the shields 311 and 313.

In addition, as shown in FIG. 5, the ion beam shields 310 may move independent of each other, and be positioned in multiple layers ahead of the wafer 100 so as to be combined to set the exposure opening 304 of the ion beam 201.

For example, when constituting the ion beam shields 310 to overlap each other in the multiple layers, four first ion beam shields 315 in a first layer may be placed in a cross shape as shown in FIG. 5 to face each other. Another four second ion beam shields 317 in a second layer may also be placed in the cross shape at a second layer to block regions between the first ion beam shields 315. In addition, other four third ion beam shields 319 in a third layer may also be placed in the cross shape to block regions between the second ion beam shields 317. The exposure opening 304 may be set to a polygonal shape or a circular shape via combination of these ion beam shields 315, 317 and 319.

In addition to the combinations of the ion beam shields 310 shown in FIGS. 4 and 5, the ion beam exposure adjustor 300 can be modified in various structures so long as it can control an exposing degree or an exposing position of the wafer 100 with respect to the ion beam 201. For example, the ion beam exposure adjustor 300 may be modified in an iris shape and the like. In addition, although the individual shields 310 are illustrated as having an identical rectangular shape in FIGS. 4 and 5, the individual ion beam shields 310 may have different shapes or sizes.

With the partial ion implantation apparatus according to the present embodiment constructed as described above, the partial or non-uniform ion implantation can be performed to a plurality of regions on the wafer 100 in different concentrations.

Figure 6:
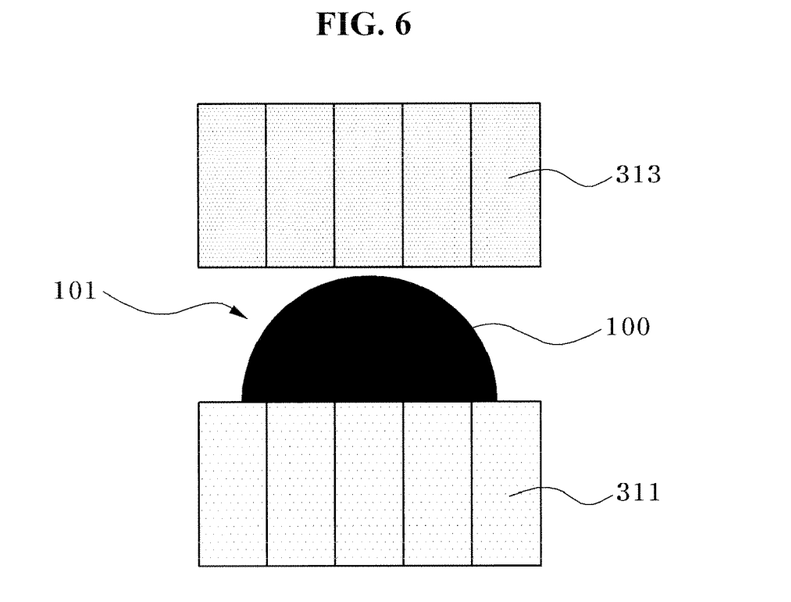
FIGS. 6 and 7 are schematic views illustrating a first example of a method for partial ion implantation in accordance with an embodiment of the present invention.
Figure 7:
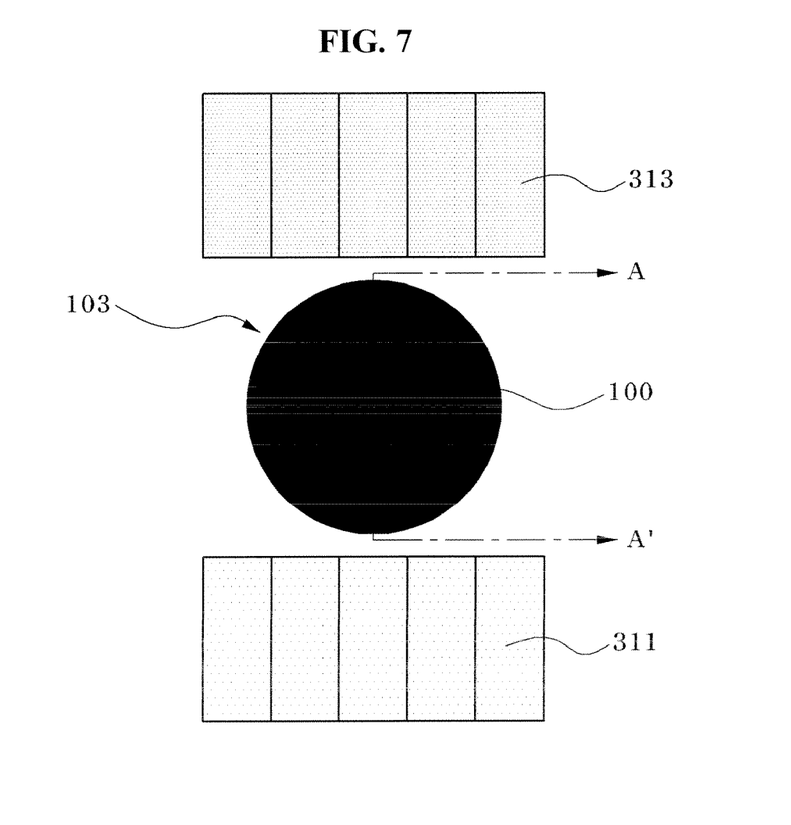
Figure 8:
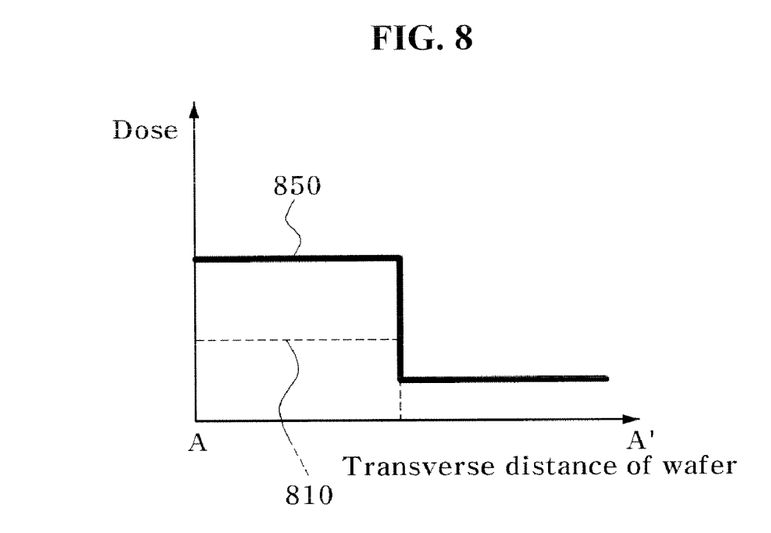
FIG. 8 is a graphical representation schematically depicting a dose distribution of implanted ions in the first example of the method.

FIGS. 6 to 8 are schematic views illustrating a first example of a method for partial ion implantation in accordance with one embodiment of the invention, and a result thereof.

Referring to FIGS. 6 and 7, the method for partial ion implantation is performed using the partial ion implantation apparatus according to the embodiment of the present invention. In the method, first, a wafer 100 is mounted on a wafer support 400 as shown in FIG. 2. At this time, combination of ion beam shields 310 constituting an ion beam exposure adjustor 300 can be realized by, for example, the two-row arrangement as shown in FIG. 4.

When the wafer 100 is mounted on the wafer support 400, a chuck acting as the wafer support 400 is lifted to a location to which an ion beam 201 is irradiated. Before the ion beam 201 is irradiated to the wafer 100, primary adjustment of the ion beam exposure adjustor 300 is performed in such a way that shields 313 of a second shield row are moved in parallel to each other so as to allow a first region 101 of the wafer 100, for example, an upper half region of the wafer 100 to be partially exposed, and that shields 311 of the second shield row are moved in parallel to each other to block a lower half of the wafer 100, as shown in FIG. 6.

In such a first combined state of the shields 311 and 313, primary ion implantation is performed by scanning ion beam on the first region of the wafer 100 exposed by the primary adjustment. In this case, as shown in a graph depicting dose distribution along line A-A' traversing the wafer in FIG. 8, the ion implantation is selectively performed only to the exposed first region of the wafer 100. Accordingly, a dose distribution graph 810 obtained by the primary ion implantation shows that ion implantation is performed only to half of the wafer 100.

Next, secondary adjustment of the ion beam exposure adjustor 300 is performed in such a way of allowing a second region 103 of the wafer, for example, the whole region of the wafer 100 including the first region 101 of the wafer 100 to be exposed to the ion beam, as shown in FIG. 7. For example, the shields 313 in the second shield row of the ion beam exposure adjustor 300 are also parallelly moved to allow the whole region of the wafer 100, that is, the second region 103 of the wafer 100 to be exposed.

In such a second combined state of the shields 311 and 313, secondary ion implantation is performed by scanning the ion beam on the exposed second region 103 of the wafer 100. In this case, as shown in the graph depicting the dose distribution along the line A-A' of FIG. 8, the ion implantation is performed to the exposed second entire region. Accordingly, a dose distribution graph 810 obtained by the primary and secondary ion implantation shows that a half region of the wafer 100 has a different dose distribution from that of another half region of the wafer 100. In other words, a stepped dose distribution graph can be obtained.

FIGS. 9 to 12 are schematic views illustrating a second example of the method for partial ion implantation according to the embodiment of the invention, and a result thereof.

Figure 9:
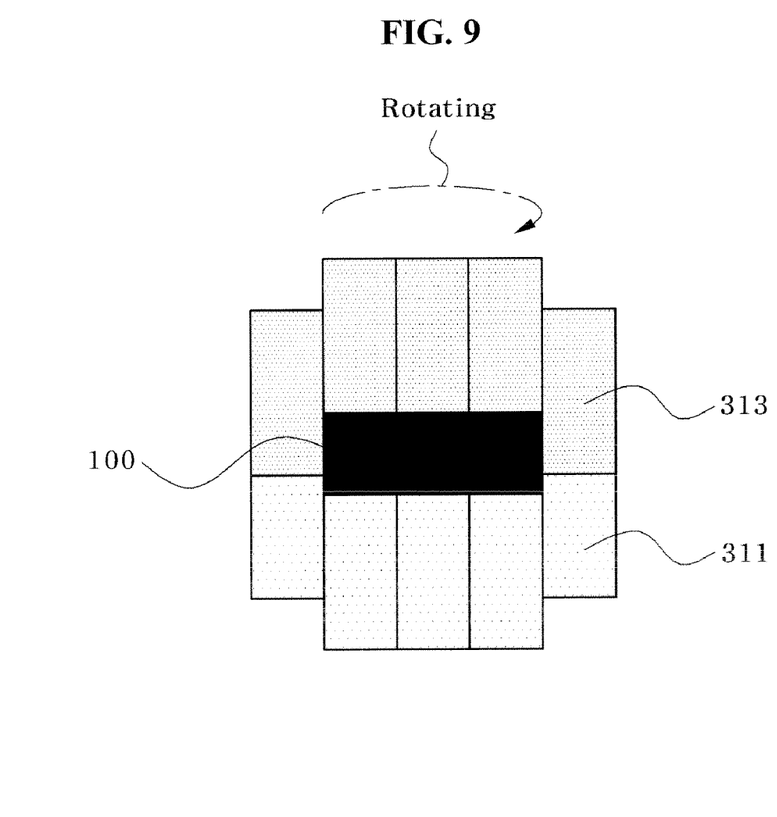
FIGS. 9 and 10 are schematic views illustrating a second example of the method for the partial ion implantation.
Figure 10:
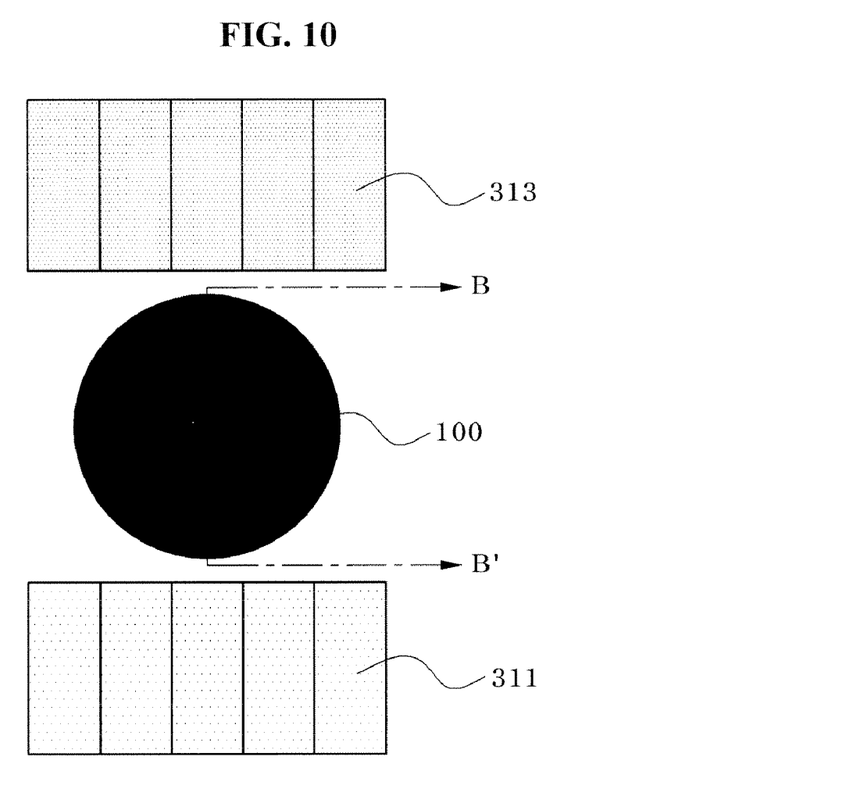

Referring to FIG. 9, the method for partial ion implantation is performed using the partial ion implantation apparatus according to the embodiment of the invention, in which shields 311 and 313 arranged in two rows are combined to set a rectangular-shaped exposure opening as shown in FIG. 9. In such a combined state of the shields 311 and 313, primary ion implantation is performed to a local region of the wafer, followed by secondary ion implantation to an overall wafer 100 as shown in FIG. 10.

During the primary and secondary ion implantation, the combination of the shields 311 and 313 or the wafer 100 may be rotated, thereby realizing a dose distribution graph having a regularly stepped-shape from the center of the wafer 100 to a peripheral edge thereof.

Figure 11:
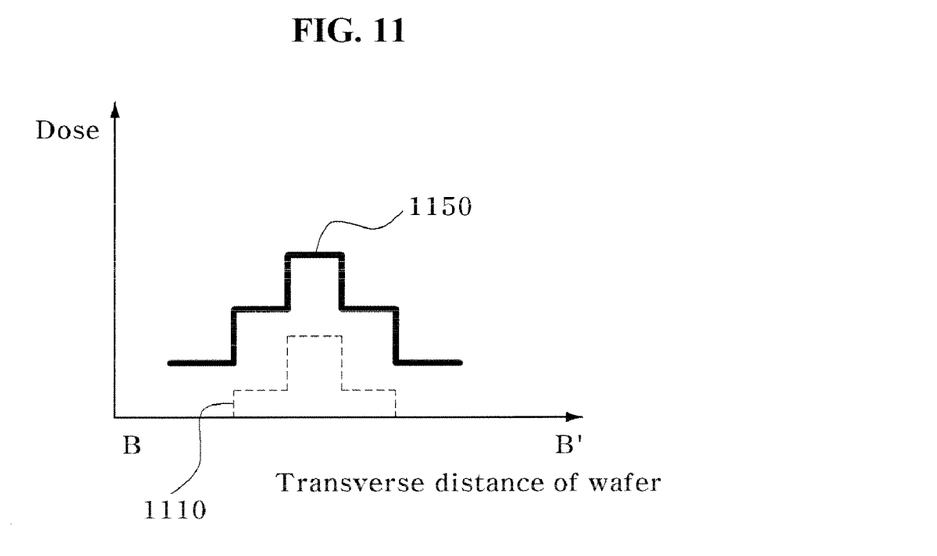
FIGS. 11 and 12 are graphical representations schematically depicting a dose distribution of implanted ions in the second example of the method.

With the ion implantation as described above, the primary ion implantation provides a dose distribution graph 1110 which can be realized in a two-step shape, as viewed along line B-B' traversing the wafer 100. In addition, a final dose distribution graph 1150 can be realized in a three-step shape.

Figure 12:
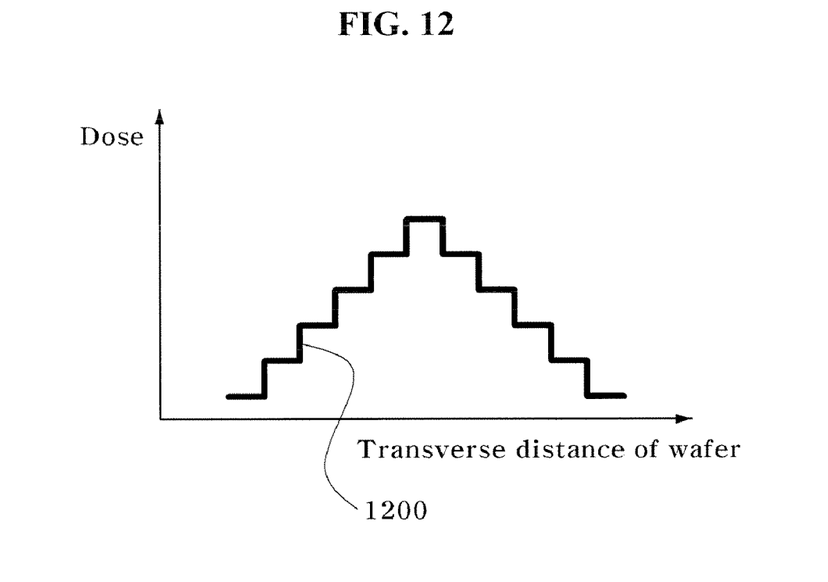

Referring to FIG. 12, when repeating the partial ion implantation several times after dividing the partial ion implantation into several steps, such as the primary and secondary ion implantation, it is possible to realize the dose distribution graph showing that different doses of ions are implanted to the plurality of regions, respectively, as in the dose distribution graph 1200 shown in FIG. 12.

Figure 13:
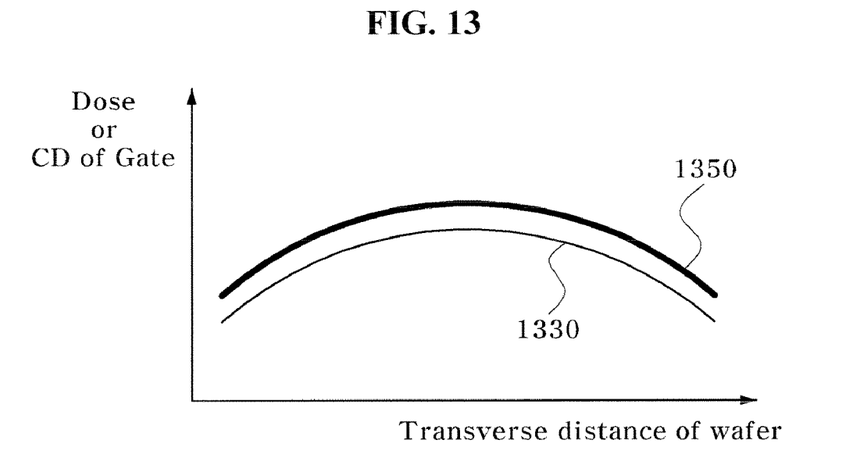
FIG. 13 is a graphical representation depicting an improved distribution of a threshold voltage Vt by partial ion implantation in accordance with an embodiment of the present invention.

FIG. 13 is a graphical representation depicting an improved distribution of a threshold voltage Vt by the partial ion implantation according to the embodiment of the invention.

Referring to FIG. 13, the apparatus and method for the partial ion implantation according to the embodiment can provide non-uniform doses of ions or non-uniform concentration distribution of dopants in the respective regions of the wafer. Thus, it is possible to use such non-uniform ion implantation for improving variation in threshold voltage Vt according to variation in the gate's CD.

For example, a distribution graph 1310 of the gate's CD can be realized in different distributions of the gate's CD at the respective regions of the wafer due to process parameters and the like upon gate patterning. For example, the distribution graph 1310 of the gate's CD can be realized in a wider gate's CD at the center of the wafer, and in a narrower gate's CD at a peripheral edge of the wafer. To compensate for variation of the threshold voltage Vt in the channel caused by such distribution of the gate's CD, the partial ion implantation according to the embodiment is performed to allow a dose distribution of ion implantation for adjusting the threshold voltage Vt of the channel to vary depending on the regions of the wafer, such as a dose distribution graph 1150 of the ion implantation shown in FIG. 13.

For example, because the wafer is relatively increased in threshold voltage Vt at the center of the wafer having a wider gate's CD, ions for adjustment of the threshold voltage Vt can be implanted in a greater dose as a dopant having opposite conductivity to a dopant for a well to lower the threshold voltage Vt for compensation of the increased threshold voltage Vt. In addition, because the wafer is relatively decreased in threshold voltage Vt at the edge of the wafer having a narrower gate's CD, ions for adjustment of the threshold voltage Vt can be implanted in a smaller dose for compensation of the decreased threshold voltage Vt.

Such non-uniform or partial ion implantation on a local region can be effectively performed using the non-uniform ion implantation apparatus according to the embodiment of the invention described with reference to FIG. 1. Accordingly, because the variation of the threshold voltage Vt in the channel caused by the variation of the gate's CD can be compensated via ion implantation, it is possible to effectively provide uniform operating characteristics of a transistor on the whole region of the wafer.

Furthermore, because the combined shape of the shields of the ion beam exposure adjustor can be changed according to the number of times for scanning with movement of the chuck acting as the wafer support upon the ion implantation, it is possible to more accurately adjust a degree of variation in dose of ion implantation. In other words, by implanting the dopant to a desired region of the wafer in a more accurate amount, it is possible to more effectively realize a dose distribution which can compensate the variation of the gate's CD depending on the distribution of the gate's CD.

As apparent from the above description, according to the present invention, the ion beam exposure adjustor including the combination of the ion beam shields is placed in front of the wafer to adjust the region of the wafer which will be exposed to ion beam. As a result, it is possible to effectively perform non-uniform or partial ion implantation such that dopants are implanted in different concentrations onto respective regions of the wafer. Thus, the variation of the threshold voltage Vt of the channel according to the regions of the wafer can be effectively compensated, thereby realizing more uniform characteristics of the transistor. In other words, it is possible to improve distribution of an effective threshold voltage Vt.

It should be understood that the embodiments and the accompanying drawings have been described for illustrative purposes and the present invention is limited by the following claims. Further, those skilled in the art will appreciate that various modifications, additions and substitutions are allowed without departing from the scope and spirit of the invention as set forth in the accompanying claims.

What is claimed is:

1. An apparatus for partial ion implantation, the apparatus comprising:
    a wafer support;
    an ion beam irradiator capable of generating and irradiating an ion beam entering a wafer; and
    an ion beam exposure adjustor for adjusting exposure of the wafer with respect to the ion beam according to regions of the wafer by setting an exposure opening via combination of ion beam shields for blocking the ion beam, the exposure opening enabling the wafer to be partially exposed to the ion beam irradiated therethrough,
    said ion beam exposure adjustor comprising a shield-combining part to move and combine the ion beam shields so as to allow variation in size and position of the exposure opening with respect to the wafer.

2. The apparatus according to claim 1, wherein the wafer support is repetitiously movable in a predetermined direction while the ion beam irradiator performs repetitious scanning of the ion beam in a direction different from the moving direction of the wafer support to allow a whole region of the wafer to be irradiated by the ion beam, and the ion beam exposure adjustor operates in conjunction with movement of the wafer support to maintain the exposure opening for the ion beam with respect to the wafer.

3. The apparatus according to claim 1, wherein the ion beam shields are positioned in front of the wafer to partially block a surface of the wafer with respect to the ion beam.

4. The apparatus according to claim 1, wherein the shield-combining part comprises a driving supporter connected to the wafer support, and a shaft connecting the driving supporter and the ion beam shields.

5. The apparatus according to claim 1, wherein the shield-combining part is capable of rotating the combination of the ion beam shields about the wafer.

6. The apparatus according to claim 1, wherein the ion beam shields are separated an equal distance from the wafer in front thereof so as to move independently in parallel to each other and then combine with each other to set the exposure opening for the ion beam.

7. The apparatus according to claim 6, wherein the ion beam shields are arranged in parallel to each other in two rows.

8. The apparatus according to claim 1, wherein the ion beam shields are positioned in multiple layers in front of the wafer, and are independently movable in parallel to each other and capable of combining with each other to set the exposure opening for the ion beam.

9. The apparatus according to claim 8, wherein the ion beam shields comprises first ion beam shields arranged in one of the layers to face each other, and second ion beam shields arranged in another layer to block a region between the first ion beam shields.

10. A method for partial ion implantation to implant ions to a plurality of regions of a wafer in different doses, comprising the steps of:
    mounting a wafer on a wafer support such that the wafer faces an ion beam irradiated from an ion beam irradiator;
    primarily adjusting an ion beam exposure adjustor to partially expose a first region of the wafer to the ion beam;
    primarily implanting ions by scanning the ion beam on the exposed first region;
    secondarily adjusting the ion beam exposure adjustor to allow a second region of the wafer to be exposed to the ion beam; and
    secondarily implanting ions by scanning the ion beam on the exposed second region.

11. The method according to claim 10, wherein the secondary ion implanting step comprises repetitiously moving the wafer support in a predetermined direction while repetitiously scanning the ion beam in a direction different from the moving direction of the wafer support to allow a whole region of the wafer to be irradiated by the ion beam, and the ion beam exposure adjustor operates in conjunction with movement of the wafer support to maintain the exposure opening for the ion beam with respect to the wafer.

12. The method according to claim 11, wherein, during the ion implanting steps, controlling the concentration of ions implanted to the regions of the wafer depending on the number of times the ion beam is repetitiously scanned.

13. The method according to claim 10, wherein each ion implanting step comprises rotating either the ion beam exposure adjustor or the wafer.

14. The method according to claim 10, further comprising: rotating either the ion beam exposure adjustor or the wafer before the secondary ion implanting step.

15. The method according to claim 10, wherein the step of adjusting the ion beam exposure adjustor comprises exposing the regions of the wafer to the ion beam by independently moving the ion beam shields of the ion beam exposure adjustor in parallel to each other, with the ion beam shields arranged in parallel to each other or with the ion beam shields arranged in multiple layers.

16. The method according to claim 10, wherein the second region of the wafer comprises the first region of the wafer.

* * * * *